(12) United States Patent
Ishida et al.

(10) Patent No.: US 10,088,858 B2
(45) Date of Patent: Oct. 2, 2018

(54) POWER SUPPLY APPARATUS

(71) Applicants: ADVANTEST CORPORATION, Nerima-ku, Tokyo (JP); The University of Tokyo, Bunkyo-ku, Tokyo (JP)

(72) Inventors: Masahiro Ishida, Tokyo (JP); Takashi Kusaka, Tokyo (JP); Rimon Ikeno, Tokyo (JP); Kunihiro Asada, Tokyo (JP); Toru Nakura, Tokyo (JP); Naoki Terao, Tokyo (JP)

(73) Assignees: ADVANTEST CORPORATION, Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/412,791

(22) Filed: Jan. 23, 2017

(65) Prior Publication Data

US 2017/0220060 A1    Aug. 3, 2017

(30) Foreign Application Priority Data

Jan. 28, 2016    (JP) ................. 2016-014282

(51) Int. Cl.
*G05F 1/625* (2006.01)
*G01R 1/02* (2006.01)
*G01R 31/28* (2006.01)

(52) U.S. Cl.
CPC ........... *G05F 1/625* (2013.01); *G01R 1/02* (2013.01); *G01R 31/28* (2013.01)

(58) Field of Classification Search
CPC ........... G05F 1/625; G01R 1/02; G01R 31/28
(Continued)

(56) References Cited

U.S. PATENT DOCUMENTS

| 8,933,716 B2 | 1/2015 | Ishida et al. |
| 2012/0224397 A1* | 9/2012 | Yeh ............ H02M 3/33507 363/21.12 |
| 2013/0229197 A1* | 9/2013 | Kusaka ............ G01R 31/2832 324/750.01 |

FOREIGN PATENT DOCUMENTS

| JP | 09-230000 A | 9/1997 |
| JP | 10-337018 A | 12/1998 |

(Continued)

OTHER PUBLICATIONS

Notificiation of Reasons for Refusal corresponding to JP Patent Application No. 2016-014282; dated Oct. 31, 2017.

*Primary Examiner* — Melissa Koval
*Assistant Examiner* — Trung Nguyen
(74) *Attorney, Agent, or Firm* — Cantor Colburn LLP (57) ABSTRACT

A power supply apparatus supplies a power supply voltage $V_{DD}$. The power supply apparatus includes a compensation circuit in addition to a main power supply. The compensation circuit receives, via its input, as a feedback signal, a detection signal $V_S$ that corresponds to the power supply voltage $V_{DD}$. The compensation circuit has input/output characteristics $f_{IO}$ that correspond to the characteristics of the main power supply and the characteristics of a target power supply to be emulated. The compensation circuit injects or otherwise draws a compensation current $i_{COMP}$ that corresponds to the detection signal $V_S$ to or otherwise from a node for generating the power supply voltage $V_{DD}$.

9 Claims, 10 Drawing Sheets

(58) Field of Classification Search
USPC .............. 324/750.01, 500, 508–511, 764.01,
324/750.03, 762.01, 537, 771
See application file for complete search history.

(56) References Cited

FOREIGN PATENT DOCUMENTS

| | | | |
|---|---|---|---|
| JP | 2000258501 | A | 9/2000 |
| JP | 2005201721 | A | 7/2005 |
| JP | 2007315829 | A | 12/2007 |

* cited by examiner

POWER SUPPLY APPARATUS

CROSS REFERENCE TO RELATED APPLICATIONS

The present invention claims priority under 35 U.S.C. § 119 to Japanese Application No. 2016-014282 filed Jan. 28, 2016, the entire content of which is incorporated herein by reference.

BACKGROUND OF THE INVENTION

1. Field of the Invention

The present invention relates to a power supply apparatus.

2. Description of the Related Art

In a testing operation for a semiconductor integrated circuit that employs CMOS (Complementary Metal Oxide Semiconductor) technology such as a CPU (Central Processing Unit), DSP (Digital Signal Processor), memory, or the like, when the circuit operates receiving the supply of a clock, electrical current flows through a flip-flop or a latch included in such a test target circuit (which will be referred to as a "DUT", i.e., Device Under Test). When the clock is stopped, the circuit enters a static state in which the amount of current decreases. Accordingly, the sum total of the operating current (load current) of the DUT changes with time depending on the content of the test operation, and so forth.

A power supply circuit that supplies electric power to such a DUT has a configuration employing a regulator, for example. Ideally, such a power supply circuit is capable of supplying a constant voltage (or otherwise current) regardless of the load current. However, in actuality, such a power supply circuit has an output impedance that is not negligible. Furthermore, there is a non-negligible impedance component between the power supply circuit and the DUT. Accordingly, the power supply voltage fluctuates due to fluctuation in the load.

In many cases, the power supply environment provided by such a test apparatus does not match the power supply environment of the actual equipment. That is to say, it is rare for such a test power supply environment to match the power supply environment of the actual equipment. Accordingly, in many cases, even if the same load fluctuation occurs in the DUT, such a load fluctuation leads to a difference in the power supply voltage waveform between the test apparatus and the actual equipment. Such a difference in the power supply voltage waveform between the test apparatus and the actual equipment leads to the potential for an overkill problem in that a DUT to be judged as a pass is wrongly judged as a fail, and a test escape problem in that a DUT to be judged as a fail is wrongly judged as a pass.

Figure 1:
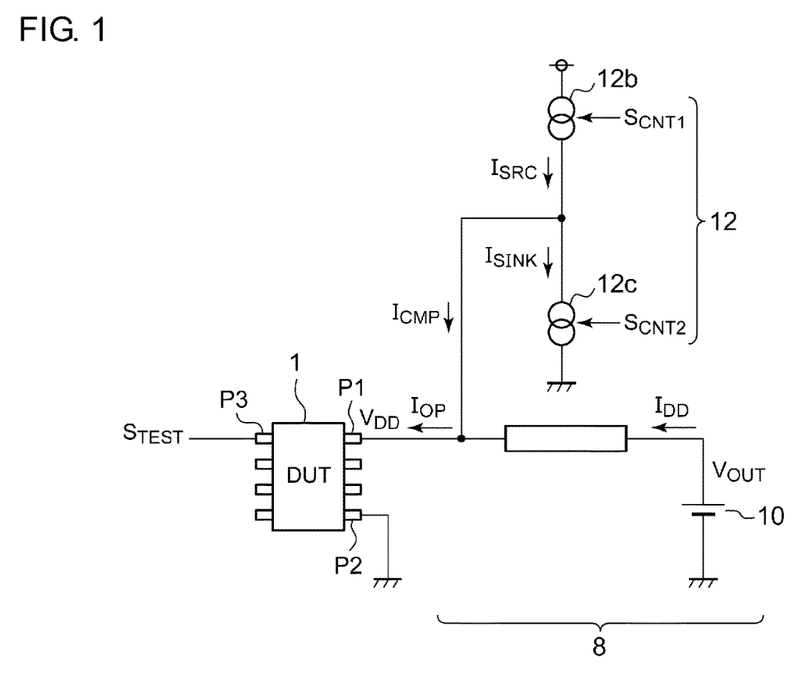
FIG. 1 is a block diagram showing a configuration of a power supply apparatus including a compensation circuit investigated by the present inventors.

FIG. 1 is a block diagram showing a configuration of a power supply apparatus including a compensation circuit investigated by the present inventors. A DUT 1 is arranged such that a power supply voltage $V_{DD}$ is supplied to its power supply terminal P1 and its ground terminal P2 is grounded. Furthermore, a test pattern $S_{TEST}$ is supplied to an I/O terminal P3 of the DUT 1 from an unshown driver of a test apparatus.

A power supply apparatus 8 includes a main power supply 10 and a power supply compensation circuit 12. The power supply apparatus 8 supplies a power supply voltage $V_{DD}$ to a power supply terminal P1 of a DUT 1. The output terminal of the main power supply 10 is coupled to the power supply terminal P1 of the DUT 1 via a power line. The main power supply 10 is configured as a linear regulator, a switching regulator, a combination of a digital control circuit and a digital/analog converter, or the like. The main power supply 10 controls an output voltage $V_{OUT}$ such that the power supply voltage $V_{DD}$ at the power supply terminal P1 matches a target voltage $V_{REF}$.

A source current source 12b included in the power supply compensation circuit 12 switches on and off according to a control pattern $S_{CNT1}$, so as to inject a pulse-shaped compensation current $I_{SRC}$ (source current) to the power supply terminal P1 of the DUT 1 via a different path without involving the main power supply 10. On the other hand, a sink current source 12c switches on and off according to a control pattern $S_{CNT2}$, so as to draw a pulse-shaped compensation current $I_{SINK}$ (sink current) via a different path without involving the DUT 1.

With such an arrangement, the compensation control patterns $S_{CNT1}$ and $S_{CNT2}$ to be supplied to the power supply compensation circuit 12 are designed based on the test pattern $S_{TEST}$ so as to cancel out deviation of the power supply voltage $V_{DD}$ that occurs according to the test pattern $S_{TEST}$ to be supplied to the DUT 1. In the actual test operation in which the test pattern $S_{TEST}$ is supplied to the DUT 1, the power supply compensation circuit 12 is controlled according to the control patterns $S_{CNT1}$ and $S_{CNT2}$. Such an arrangement allows the power supply voltage $V_{DD}$ to be maintained at a constant level.

In order to prevent such an overkill problem and such a test escape problem due to a difference in the power supply environment between the test apparatus and the actual equipment as described above, there is a demand for providing the test operation for such a DUT with a power supply environment that is equivalent to the actual DUT operation environment. In the present specification, an operation to be performed in order to meet such a demand will be referred to as "emulation". With the power supply compensation circuit shown in FIG. 1, the control pattern $S_{CNT}$ may be designed so as to instruct the power supply compensation circuit to supply a compensation current that changes with time in order to provide a desired power supply voltage waveform, i.e., the same power supply voltage waveform as that generated in the actual equipment. Such an arrangement is capable of reproducing the power supply environment of the actual equipment.

However, with the power supply apparatus 8 shown in FIG. 1, there is a need to calculate the compensation current waveforms (i.e., the control patterns $S_{CNT1}$ and $S_{CNT2}$) every time the device operation condition (i.e., the test pattern $S_{TEST}$) is changed. This leads to a problem of high costs required in the test operation.

Furthermore, such a compensation operation is classified as a predictive control operation. Thus, such a compensation operation cannot sufficiently compensate for an unknown variation component due to individual variation of the DUT characteristics or the like. In some cases, such an arrangement cannot provide sufficient compensation precision. In order to compensate for the variation component due to such individual variation, there is a need to measure the characteristics for each DUT beforehand. Such an approach involves further increased costs required in the test operation.

Moreover, in principle, the operation of the power supply compensation circuit shown in FIG. 1 requires that the device operation condition (test pattern $S_{TEST}$) is known. This leads to reduction in the range of application, which is a problem.

Description has been made above regarding a problem to be solved by the present invention with reference to emulation provided by the power supply circuit for the test apparatus. However, it is possible that, in some cases, a power supply apparatus employed in other apparatuses that differ from such a test apparatus is required to emulate a different power supply environment.

SUMMARY OF THE INVENTION

The present invention has been made in order to solve such a problem. Accordingly, it is an exemplary purpose of an embodiment of the present invention to provide a power supply apparatus that is capable of emulating or reproducing a desired power supply environment using a new approach that differs from conventional techniques.

An embodiment of the present invention relates to a power supply apparatus structured to supply a power supply voltage. The power supply apparatus comprises: a main power supply; and a compensation circuit structured to receive, via an input terminal thereof, as a feedback signal, a detection signal that corresponds to the power supply voltage, to have input/output characteristics that correspond to characteristics of the main power supply and characteristics of a target power supply to be emulated, and to inject or otherwise draw a compensation current that corresponds to the detection signal to or otherwise from a power supply voltage generating node for generating the power supply voltage.

Such an embodiment is capable of emulating or reproducing the waveform of the power supply voltage generated by the target power supply.

It should be noted that the characteristics of the power supply as used here represent the characteristics having a correlation with the frequency characteristics of the power supply, examples of which include the impedance, conductance, and impulse response.

Also, the input/output characteristics may correspond to a conductance of the main power supply and a conductance of the target power supply. It should be noted that conductance is the reciprocal of impedance. Thus, it can be assumed that the input/output characteristics correspond to the reciprocal of the impedance.

Also, the input/output characteristics may correspond to a difference between the conductance of the main power supply and the conductance of the target power supply.

Also, the compensation circuit may comprise: a calculation unit structured to generate a control signal that indicates a current that flows through a conductance that corresponds to the aforementioned difference when the power supply voltage indicated by the detection signal is applied; and a current source structured to generate the compensation current that corresponds to the control signal.

Also, the calculation unit may comprise an analog filter or otherwise an analog amplifier. Also, the calculation unit may comprise a digital filter.

Also, in a case in which the main power supply and the target power supply can each be regarded as multiple electrically equivalent circuits in parallel, the compensation circuit may comprise multiple calculation units each structured to calculate a compensation current for a corresponding circuit. By assuming that the conductance of the main power supply and the conductance of the target power supply can each be represented by multiple conductance components, and by controlling the compensation current for each conductance component, such an arrangement facilitates circuit design, and allows the circuit to have a simple circuit configuration.

Another embodiment of the present invention relates to a test apparatus. The test apparatus may comprise any one of the aforementioned power supply apparatuses.

This allows the actual equipment environment in which the DUT is operated to be emulated, thereby suppressing an overkill problem and a test escape problem.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not affect the electric connection therebetween, in addition to a state in which the member A is physically and directly coupled to the member B. Similarly, the state represented by the phrase "the member C is provided between the member A and the member B" includes a state in which the member A is indirectly coupled to the member C, or the member B is indirectly coupled to the member C via another member that does not affect the electric connection therebetween, in addition to a state in which the member A is directly coupled to the member C, or the member B is directly coupled to the member C.

Figure 2:
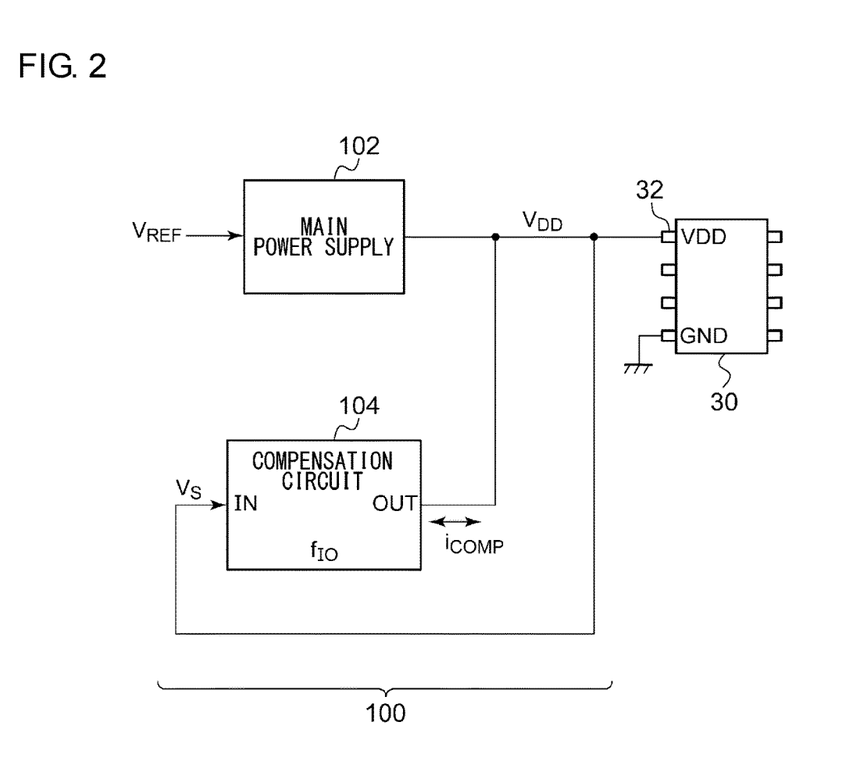
FIG. 2 is a block diagram showing a power supply apparatus according to an embodiment.

FIG. 2 is a block diagram showing a power supply apparatus according to an embodiment. A power supply apparatus 100 supplies a power supply voltage $V_{DD}$ to a circuit 30. The circuit 30 may be configured as a semiconductor device. Also, the circuit 30 may be configured as multiple circuit elements mounted on a substrate. For convenience, the supply source (generating node) for supplying the power supply voltage $V_{DD}$ will be referred to as a "power supply terminal 32".

The power supply apparatus 100 includes a main power supply 102 and a compensation circuit 104. The main power supply 102 is configured as a constant voltage source that stabilizes the power supply voltage $V_{DD}$ to a target voltage $V_{REF}$, for example. The kind of the main power supply 102 is not restricted in particular. The main power supply 102 may be configured as a switching regulator, a linear regulator, a combination of a digital control circuit and a D/A converter, or the like.

The compensation circuit 104 receives, via its input IN, as a feedback signal, a detection signal $V_S$ that corresponds to the power supply voltage $V_{DD}$. Furthermore, the output OUT of the compensation circuit 104 is coupled to the power supply terminal $V_{DD}$ configured as a power supply voltage $V_{DD}$ source. The compensation circuit 104 injects (as a source current) or draws (as a sink current) a compensation current $i_{COMP}$ that corresponds to the detection signal $V_S$ to or from the power supply terminal 32 configured as a power supply voltage $V_{DD}$ generating node. For simplicity of description, description will be made below regarding an arrangement in which $V_S=V_{DD}$. However, the present invention is not restricted to such an arrangement. Also, the detection voltage $V_S$ may be configured as a signal obtained by dividing the power supply voltage $V_{DD}$. Also, the detection voltage $V_S$ may be configured as a signal obtained by amplifying the power supply voltage $V_{DD}$.

The input/output characteristics $f_{IO}$ of the compensation circuit 104 are set according to the characteristics of the main power supply 102 and the characteristics of a target power supply 110 to be emulated. The characteristics of the power supply as used here represent the characteristics having a correspondence with the frequency characteristics of the power supply. Examples of such characteristics of the power supply include (i) impedance, (ii) conductance, (iii) impulse response or step response. For ease of understanding and simplicity of description, description will be made directing attention to a conductance G as a representative power supply characteristic.

Figure 3A:
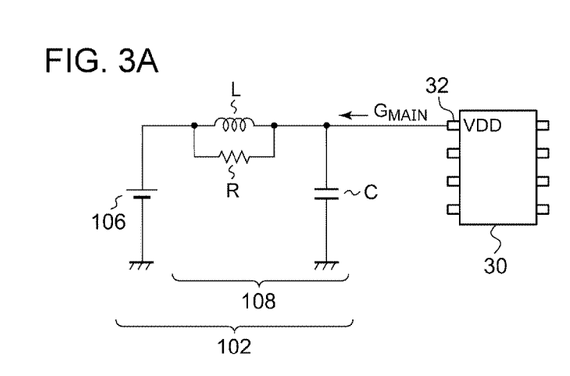
FIGS. 3A through 3D are diagrams for explaining the mechanism of the power supply apparatus.

FIGS. 3A through 3D are diagrams each showing a mechanism of the power supply apparatus 100. FIG. 3A shows an equivalent circuit diagram for the main power supply 102. The main power supply 102 includes an ideal power supply 106 and a circuit network 108. The circuit network 108 includes various kinds of impedances such as an internal impedance of the power supply 102, an impedance of a power supply line from the main power supply 102 up to the circuit 30, a capacitor impedance due to a bypass capacitor or the like, etc. Accordingly, the circuit network 108 represents the response characteristics (frequency characteristics) of the main power supply 102. The main power supply 102 corresponds to a circuit block including all the circuit elements having effects on the waveform of the power supply voltage $V_{DD}$. Specifically, the circuit block that corresponds to the main power supply 102 includes a power supply line, a bypass capacitor, and the like, in addition to a main component such as a switching regulator, a linear regulator, or the like. For clarification of the present invention, description will be made as an example regarding a model case in which the circuit network 108 is configured as a combination of a shunt capacitor C, a series inductor L, and a series resistor R. However, the present invention is not restricted to such an arrangement.

Description will be made assuming that the circuit network 108 of the main power supply 102 has a conductance $G_{MAIN}$. With the voltage at the output node of the circuit network 108 (i.e., the power supply voltage $V_{DD}$ generating node) as v, and with the current that flows through the circuit network 108 as i, the conductance of the circuit network 108 is represented by the following Expression (1).

$$i = G_{MAIN} \times V$$

It can be approximated that the ideal power supply 106 has an impedance of zero. Accordingly, the conductance $G_{MAIN}$ shown in FIG. 3A is represented by the following Expression (2)

$$G_{MAIN} = 1/j\omega L + 1/R + j\omega C \quad (2)$$

Figure 3B:
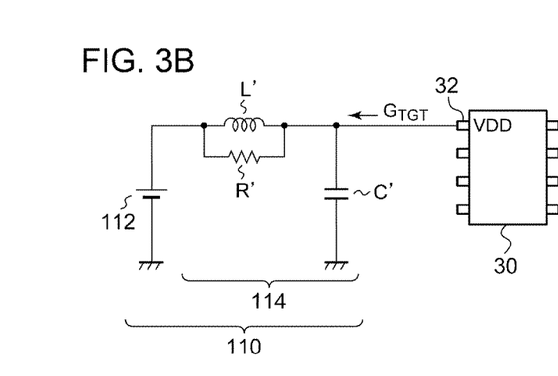

FIG. 3B shows an equivalent circuit diagram for the target power supply 110 to be emulated. The target power supply 110 can be represented by a model of a combination of an ideal power supply 112 and a circuit network 114. The conductance $G_{TGT}$ of the circuit network 114 is represented by the following Expression (3).

$$G_{TGT} = 1/j\omega L' + 1/R' + j\omega C' \quad (3)$$

Figure 3C:
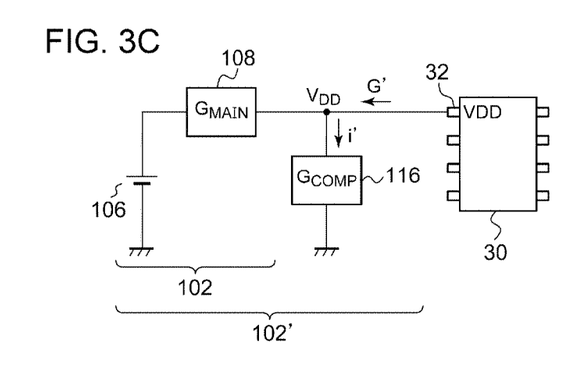

FIG. 3C shows a power supply circuit 102' further including a circuit network 116 in addition to the main power supply 102 shown in FIG. 3A. The circuit network 116 has a compensation conductance $G_{COMP}$ that corresponds to a difference between the conductance $G_{TGT}$ of the target power supply 110 and the conductance $G_{MAIN}$ of the main power supply 102, which is represented by the following Expression.

$$G_{COMP} = G_{TGT} - G_{MAIN}$$

In FIG. 3C, the conductance G' of the main power supply 102' side as viewed from the power supply terminal 32 side is represented by the following Expression (4). That is to say, the conductance G' is equal to the conductance $G_{TGT}$ of the target power supply 110 shown in FIG. 3B.

$$G' = G_{MAIN} + G_{COMP} = G_{MAIN} + (G_{TGT} - G_{MAIN}) = G_{TGT} \quad (4)$$

The current i' that flows through the circuit network 116 is represented by the following Expression (5) using the power supply voltage $V_{DD}$.

$$i' = G_{COMP} \times V_{DD}) \quad (5)$$

Figure 3D:
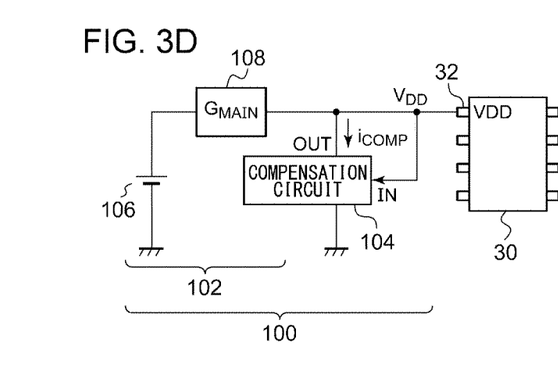

FIG. 3D shows an equivalent circuit diagram for the power supply apparatus 100 according to the embodiment. The compensation circuit 104 of the power supply apparatus 100 is configured as a current source that generates the current i' that flows through the circuit network 116 shown in FIG. 3C. With such an arrangement, when the following Expression (6), which represents the input/output characteristics of the compensation circuit 104, holds true, the power supply apparatus 100 shown in FIG. 3D is equivalent to the power supply circuit 102' shown in FIG. 3C (i.e., the target power supply 110 shown in FIG. 3B).

$$i_{COMP} = G_{COMP} \times V_{DD}$$

That is to say, the compensation circuit 104 is arranged such that its input is set to the detection signal $V_S$ that corresponds to the power supply voltage $V_{DD}$, and such that its output is set to the compensation current $i_{COMP}$. With such an arrangement, the input/output characteristics $f_{IO}$ of the compensation circuit 104 may preferably be set based on the difference between the conductance $G_{TGT}$ of the target power supply 110 and the conductance $G_{MAIN}$ of the main power supply 102.

The above is the mechanism of the power supply apparatus 100. With the power supply apparatus 100, by setting the input/output characteristics $f_{IO}$ of the compensation circuit 104 based on the characteristics (e.g., conductance values) of the target power supply 110 and the main power supply 102, such an arrangement is capable of emulating the power supply environment provided by the target power supply 110.

The present invention encompasses various kinds of apparatuses, circuits, and methods that can be regarded as a block configuration or a circuit configuration shown in FIG. 2 or FIG. 3, or otherwise that can be derived from the aforementioned description. That is to say, the present invention is not restricted to a specific circuit configuration. More specific description will be made below regarding an example configuration for clarification and ease of understanding of the essence of the present invention and the circuit operation. That is to say, the following description is by no means be intended to restrict the technical scope of the present invention.

Description will be made below regarding specific example configurations of the compensation circuit 104.

Figure 4A:
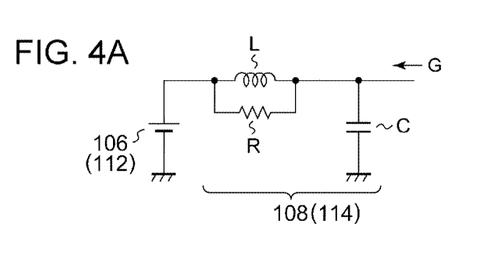
FIGS. 4A and 4B are equivalent circuit diagrams each showing an example of a circuit network.
Figure 4B:
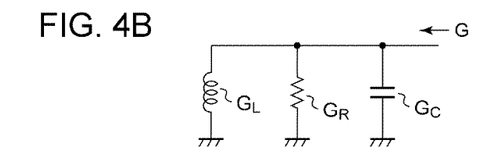
Figure 4C:
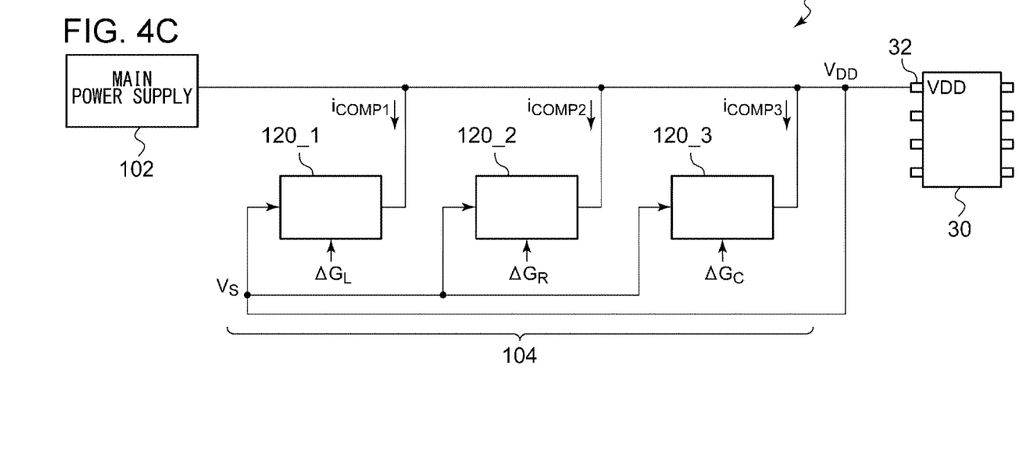
FIG. 4C is a block diagram showing an example configuration of the power supply apparatus.

FIGS. 4A and 4B are equivalent circuit diagrams each showing an example of the circuit network 108 (114). FIG. 4C is a block diagram showing an example configuration of the power supply apparatus 100. In FIG. 4A, the ideal power supply 106 (112) can be taken to be equivalent to a short-circuit state. Thus, the equivalent circuit shown in FIG. 4B is derived. That is to say, the conductance G of the circuit network 108 can be assumed to be equivalent to a parallel coupling of a shunt capacitor C having a conductance $G_C$, a series resistor R having a conductance $G_R$, and a series inductor L having a conductance $G_L$.

$$G = G_C + G_R + G_L$$

With the L component, the R component, and the C component of the main power supply 102 as $L_1$, $R_1$, and $C_1$, the corresponding conductance values $G_{L1}$, $G_{R1}$, and $G_{C1}$ are represented by the following Expressions.

$$G_{L1} = 1/j\omega L_1$$

$$G_{R1} = 1/R_1$$

$$G_{C1} = j\omega C_1$$

$$G_{MAIN} = G_{L1} + G_{R1} + G_{C1}$$

In the same way, with the L component, the R component, and the C component of the target power supply 110 as $L_2$, $R_2$, and $C_2$, the corresponding conductance values $G_{L2}$, $G_{R2}$, and $G_{C2}$ are represented by the following Expressions.

$$G_{L2} = 1/j\omega L_2$$

$$G_{R2} = 1/R_2$$

$$G_{C2} = j\omega C_2$$

$$G_{TGT} = G_{L2} + G_{R2} + G_{C2}$$

The conductance difference (compensation conductance) $G_{COMP}$ is represented by the following Expression (6).

$$G_{COMP} = G_{TGT} - G_{MAIN} \quad (6)$$
$$= \Delta G_L + \Delta G_R + \Delta G_C$$
$$= (G_{L2} - G_{L1}) + (G_{R2} - G_{R1}) + (G_{C2} - G_{C1})$$

With such an arrangement, the expression $i_{COMP} = G_{COMP} \times V_S = \{\Delta G_L + \Delta G_R + \Delta G_C\} \times V_S$ holds true. Thus, the conductance differences $\Delta G_L$, $\Delta G_R$, and $\Delta G_C$, which respectively correspond to the L component (inductive component), R component (resistive component), and C component (capacitive component), may preferably be compensated for independently. In this case, as shown in FIG. 4C, the compensation circuit 104 may be configured as three separate compensation units 120_1 through 120_3 that compensate for the L component, R component, and C component, respectively. The input/output characteristics of the compensation unit 120_1 are set according to $\Delta G_L$. The input/output characteristics of the compensation unit 120_2 are set according to $\Delta G_R$. The input/output characteristics of the compensation unit 120_3 are set according to $\Delta G_C$.

Figure 5A:
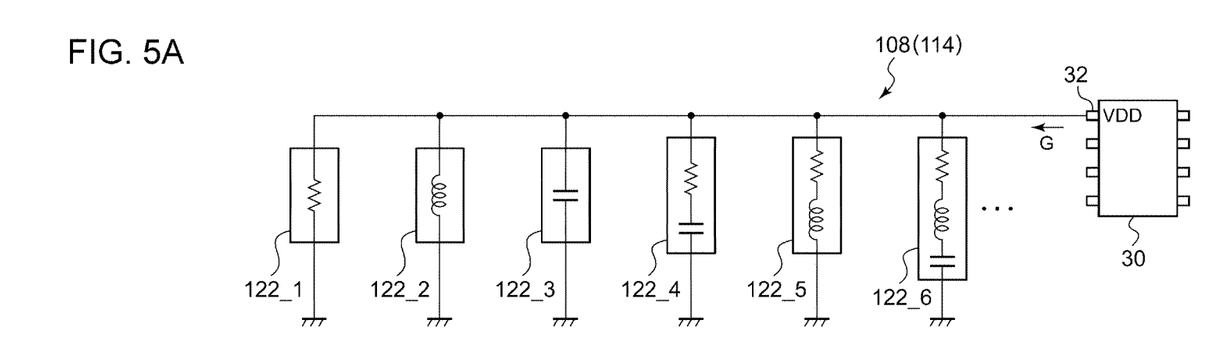
FIGS. 5A and 5B are diagrams showing a generalized circuit network and a generalized compensation circuit.
Figure 5B:
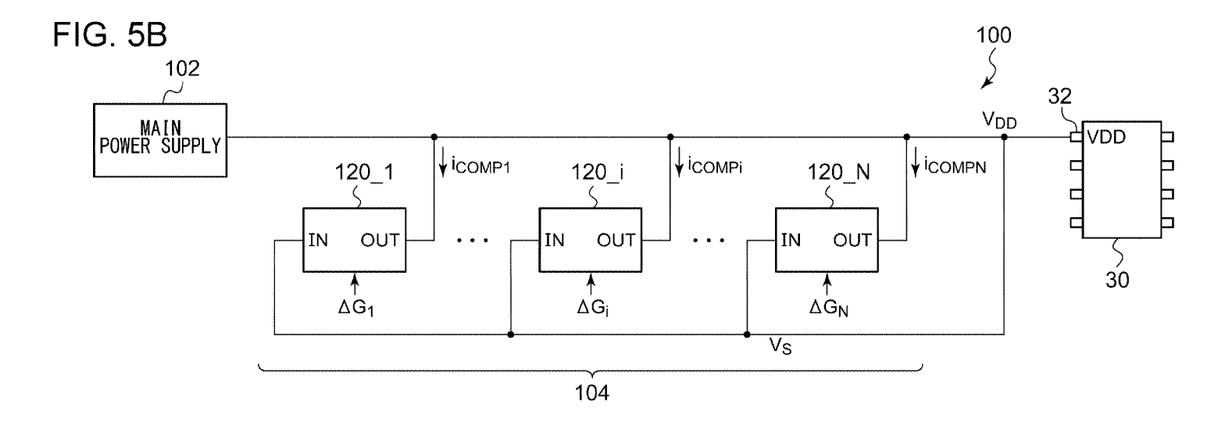

FIGS. 5A and 5B are diagrams showing a generalized circuit network 108 (114) and a generalized compensation circuit 104, respectively. The circuit network 108 (114) can be assumed to be equivalent to a parallel coupling of N (multiple) circuits (bypass circuits) 122 as viewed from the power supply terminal 32. With the conductance of the i-th ($1 \leq i \leq N$) shunt circuit 122 as $G_i$, the conductance of the overall circuit network is represented by the following Expression (7). In this case, the compensation circuit 104 may be configured as multiple, i.e., N, compensation units 120.

$$G = \Sigma_{i=1:N} G_i \quad (7)$$

For example, the shunt circuit 122_1 has a resistive conductance. The shunt circuit 122_2 has an inductive conductance. The shunt circuit 122_3 has a capacitive conductance. The shunt circuit 122_4 has a conductance of a series coupling of a resistor and a capacitor. The shunt circuit 122_5 has a conductance of a series coupling of a resistor and an inductor. The shunt circuit 122_6 has a conductance of a series coupling of a resistor, a capacitor, and an inductor. Such an approach allows the compensation circuit 104 to be designed in a simple manner.

Figure 6A:
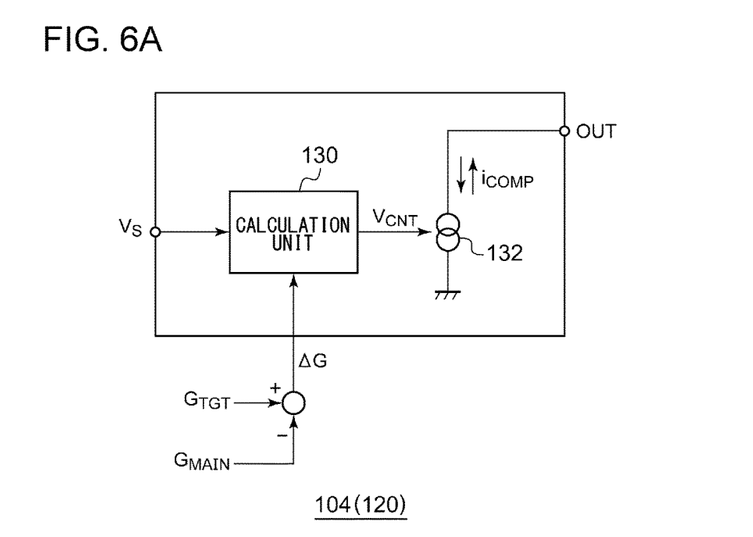
FIGS. 6A and 6B are circuit diagrams each showing an example configuration of the compensation circuit.

FIGS. 6A and 6B are circuit diagrams each showing an example configuration of the compensation circuit 104. The compensation circuit 104 shown in FIG. 6A includes a calculation unit 130 and a current source 132. In a case in which the compensation circuit 104 includes multiple compensation units 120 as shown in FIG. 5, each compensation unit 120 includes a calculation unit 130 and a current source 132.

The calculation unit 130 generates a control signal $V_{CNT}$ that indicates a current that flows through the conductance that corresponds to the conductance difference $\Delta G$ when the power supply voltage $V_{DD}$, which is indicated by the detection signal $V_S$, is applied.

$$V_{CNT} = \Delta G \times V_{DD}$$

The current source 132 generates the compensation current $i_{COMP}$ that corresponds to the control signal $V_{CNT}$. That is to say, the current source 132 can be regarded as a V/I converter circuit having a variable gain A or otherwise a transconductance amplifier having a variable gain A.

$$i_{COMP} = V_{CNT} \times A$$

Figure 6B:
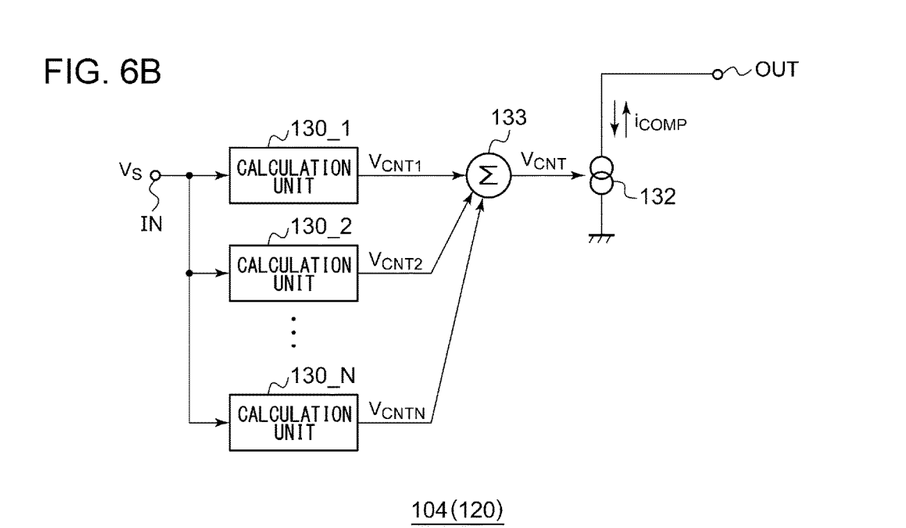

The compensation circuit 104 shown in FIG. 6B corresponds to the compensation circuit 104 as shown in FIG. 5B including multiple compensation units 120. The current source 132 is shared between the multiple compensation units 120. A calculation unit 130 is provided for each compensation unit 120. An adder 133 calculates the sum of the control signals $V_{CNT1}$ through $V_{CNTN}$ generated by the multiple compensation units 120_1 through 120_N. The current source 132 converts the control signal $V_{CNT}$ thus calculated into the compensation current $i_{COMP}$.

The compensation circuit 104 may be configured as an analog circuit, a digital circuit, or otherwise a combination of an analog circuit and a digital circuit, which will be described below.

[Implementation by Means of an Analog Circuit]

Figure 7:
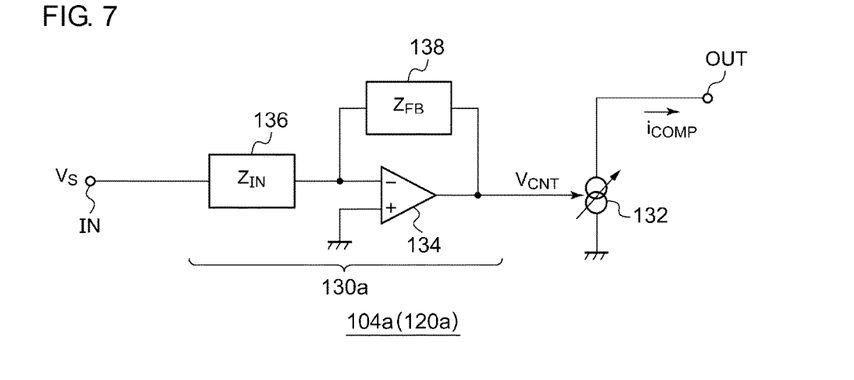
FIG. 7 is a circuit diagram showing a compensation circuit having a first example configuration.

FIG. 7 is a circuit diagram showing a compensation circuit 104a having a first example configuration. In the compensation circuit 104a shown in FIG. 7, a calculation unit 130a is configured as an inverting amplifier employing an operational amplifier or a filter. Specifically, the calculation unit 130a includes an operational amplifier 134, an input circuit 136, and a feedback circuit 138. With the impedance of the input circuit 136 as $Z_{IN}$, and with the impedance of the feedback circuit 138 as $Z_{FB}$, the input/output characteristics of the calculation unit 130a are represented by the following Expression (7). Furthermore, the compensation current $i_{COMP}$ is represented by the following Expression (8). Here, with regard to the compensation current $i_{COMP}$, a negative value corresponds to a sink current, and a positive value corresponds to a source current.

$$V_{CNT} = -Z_{FB}/Z_{IN} \times V_S \quad (7)$$

$$i_{COMP} = V_{CNT} \times A = -A \times Z_{FB}/Z_{IN} \times V_S \quad (8)$$

It should be noted that, when the conversion gain A of the current source 132 is set to a negative value, the compensation current $i_{COMP}$ has a positive value, i.e., is a source current. In this case, such an arrangement is capable of compensating for a negative impedance (resistor, capacitor, inductance, or the like).

The compensation circuit 104a shown in FIG. 7 is capable of compensating for a capacitive, a resistive, an inductive conductance, and a conductance that is a combination thereof.

[Capacitive Conductance]

For example, in a case of compensating for a capacitive conductance as with the compensation unit 120_3 shown in FIG. 4C, the input circuit 136 may preferably be configured as a capacitor $C_{IN}$, and the feedback circuit 138 may preferably be configured as a resistor $R_{FB}$. In this case, the impedance $Z_{IN}$ is represented by $Z_{IN} = 1/(j\omega C_{IN})$. Thus, the compensation current $i_{COMP}$ is represented by the following Expression.

$$i_{COMP} = -A \times R_{FB}/(j\omega C_{IN})^{-1} \times V_S$$

In a case in which the conductance $\Delta G_C$ to be compensated for is represented by $\Delta G_C = j\omega C$, and in a case in which the relation $V_S = V_{DD}$ holds true, the values A, $R_{FB}$, and $C_{IN}$ may preferably be designed so as to satisfy the relation represented by the following Expression (9).

$$j\omega C = -A \times R_{FB}/(j\omega C_{IN})^{-1} \quad (9)$$

[Resistive Conductance]

For example, in a case of compensating for a resistive conductance component as with the compensation unit 120_2 shown in FIG. 4C, the input circuit 136 may preferably be configured as a resistor $R_{IN}$, and the feedback circuit 138 may preferably be configured as a resistor $R_{FB}$. In this case, the impedance $Z_{IN}$ is represented by $Z_{IN} = R_{IN}$. Thus, the compensation current $i_{COMP}$ is represented by the following Expression.

$$i_{COMP} = -A \times R_{FB}/R_{IN} \times V_S$$

In a case in which the conductance difference $\Delta G_R$ to be compensated for is represented by $\Delta G_R = 1/R$, and in a case in which the relation $V_S = V_{DD}$ holds true, the values A, $R_{FB}$, and $R_{IN}$ may preferably be designed so as to satisfy the relation represented by the following Expression (10).

$$1/R = -A \times R_{FB}/R_{IN} \quad (10)$$

[Resistive Conductance Plus Capacitive Conductance]

In a case in which the compensation circuit 104a (or compensation unit 120a) compensates for the conductance difference that is equivalent to a series coupling of a resistor R and a capacitor C, the input circuit 136 may preferably be configured as a series coupling of a resistor $R_{IN}$ and a capacitor $C_{IN}$, and the feedback circuit 138 may preferably be configured as a resistor $R_{FB}$. In this case, the impedance $Z_{IN}$ is represented by $Z_{IN} = R_{IN} + (j\omega C_{IN})^{-1}$. Thus, the compensation current $i_{COMP}$ is represented by the following Expression.

$$i_{COMP} = -A \times R_{FB}/\{R_{IN} + (j\omega C_{IN})^{-1}\} \times V_S$$

In a case in which the conductance difference $\Delta G$ to be compensated for is represented by $\Delta G = 1/\{R + (j\omega C)^{-1}\}$, and in a case in which the relation $V_S = V_{DD}$ holds true, the values A, $R_{FB}$, R, and C may preferably be designed such that the relations $R = R_{IN}/(R_{FB} \times A)$ and $C = -C_{IN} \times R_{FB} \times A$ hold true.

[Inductive Conductance]

In a case of compensating for an inductive conductance as with the compensation unit 120_1 shown in FIG. 4C, the input circuit 136 may preferably be configured as a resistor $R_{IN}$, and the feedback circuit 138 may preferably be configured as a capacitor $C_{FB}$. In this case, the impedance $Z_{IN}$ is represented by $Z_{IN} = R_{IN}$, and the impedance $Z_{FB}$ is represented by $Z_{FB} = (j\omega C_{FB})^{-1}$. Thus, the compensation current $i_{COMP}$ is represented by the following Expression.

$$i_{COMP} = -A/(j\omega C_{FB} \cdot R_{IN})^{-1} \times V_S$$

In a case in which the conductance to be compensated for is represented by 66 $G_C = 1/j\omega L$, and in a case in which the relation $V_S = V_{DD}$ holds true, the values A, $R_{IN}$, and $C_{FB}$ may preferably be designed so as to satisfy the relation represented by the following Expression (11).

$$L = -C_{FB} \times R_{IN}/A \quad (11)$$

[Resistive Conductance Plus Inductive Conductance]

In a case in which the conductance difference to be compensated for is equivalent to a series coupling of an inductor L and a resistor R, the input circuit 136 may preferably be configured as a resistor $R_{IN}$, and the feedback circuit 138 may preferably be configured as a parallel coupling of a resistor $R_{FB}$ and a capacitor $C_{FB}$. In this case, the impedance $Z_{IN}$ is represented by $Z_{IN} = R_{IN}$, and the impedance $Z_{FB}$ is represented by $Z_{FB} = 1/(R_{FB}^{-1} + j\omega C_{FB})$. Furthermore, the compensation current $i_{COMP}$ is represented by $i_{COMP} = -A/(R_{IN}/R_{FB} + j\omega C_{FB} \cdot R_{IN}) \times V_S$.

In a case in which the conductance to be compensated for is represented by $\Delta G = 1/(R + j\omega L)$, the values A, $R_{IN}$, $R_{FB}$, and $C_{FB}$ may preferably be designed such that the relations $R = R_{IN}/R_{FB}/A$ and $L = C_{FB} \cdot R_{IN}/A$ hold true.

Figure 8:
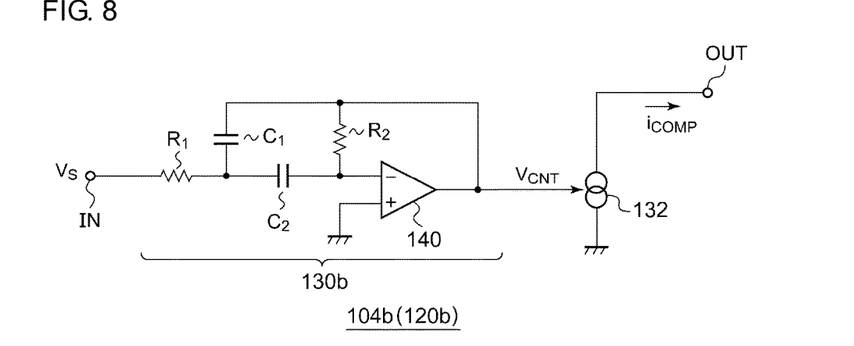
FIG. 8 is a circuit diagram showing a compensation circuit having a second example configuration.

FIG. 8 is a circuit diagram showing a compensation circuit 104b having a second example configuration. The compensation circuit 104b is capable of compensating for a conductance of a series coupling of a resistive conductance, an inductive conductance, and a capacitive conductance. A calculation unit 130b includes an operational amplifier 140, resistors R1 and R2, and capacitors C1 and C2. The input/output characteristics of the calculation unit 130b are represented by the following Expression (12).

$$V_{CNT} = \{j\omega C_1 \cdot R_1 + (j\omega C_2 \cdot R_2)^{-1} + (C_1+C_2)/C_2 \times R_1/R_2\}^{-1} \times V_S.$$

$$i_{COMP} = -A \times V_{CNT}$$
$$= -A/\{j\omega C_1 \cdot R_1 + (j\omega C_2 \cdot R_2)^{-1} + (C_1+C_2)/C_2 \times R_1/R_2\} \times V_S$$
(12)

In a case in which the conductance difference ΔG to be compensated for is equivalent to a series coupling of L, C, and R, and is represented by $\Delta G=\{j\omega L+(j\omega C)^{-1}+R\}$, the circuit constants may preferably be determined such that the relations $L=C_1 \cdot R_1/A$, $C=A \cdot C_2 \cdot R_2$, and $R=(C_1+C_2)/C_2 \times R_1/R_2/A$ hold true.

It can be readily conceived by those skilled in this art that, in addition to the compensation circuit 104 described above for exemplary purposes, various circuit configurations may be employed, which are also encompassed in the technical scope of the present invention.

[Implementation by Means of a Digital Circuit]

Figure 9:
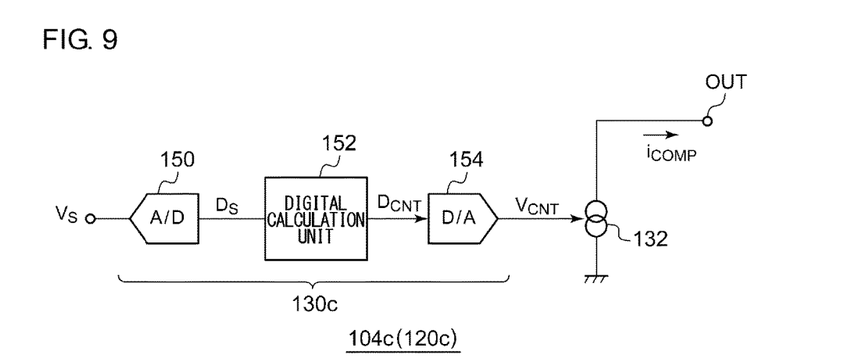
FIG. 9 is a circuit diagram showing the compensation circuit having a third example configuration.

FIG. 9 is a circuit diagram showing a compensation circuit 104c having a third example configuration. A calculation unit 130c includes an A/D converter 150, a digital calculation unit 152, and a D/A converter 154. The A/D converter 150 converts the detection signal $V_S$ into a digital value $D_S$. The digital calculation unit 152 performs digital calculation so as to provide calculation that corresponds to the aforementioned calculation unit 130. As a result, the digital calculation unit 152 generates a control value $D_{CNT}$ that corresponds to the control signal $V_{CNT}$. The D/A converter 154 converts the control value $D_{CNT}$ into the analog control signal $V_{CNT}$. The D/A converter 154 and the current source 132 may be monolithically integrated, i.e., may be configured as a single current DAC.

Figure 10A:
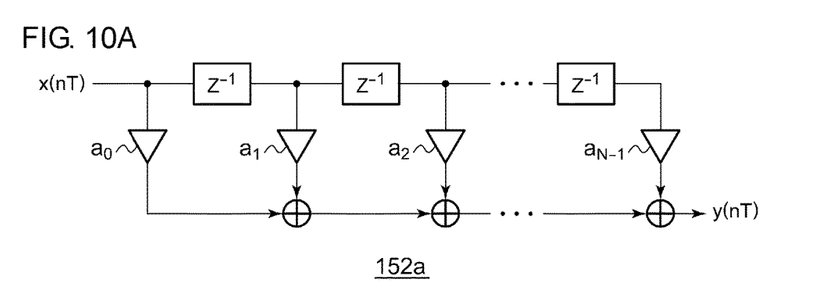
FIGS. 10A and 10B are circuit diagrams each showing an example configuration of a digital calculation unit of a FIR filter.
Figure 10B:
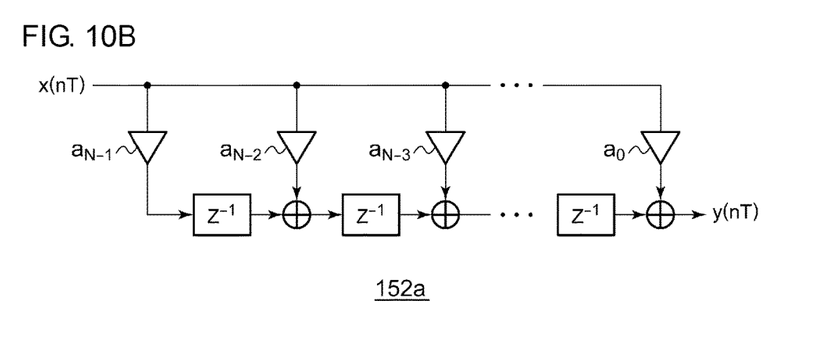

For example, the digital calculation unit 152 may be configured as a digital filter. Such a filter may be configured as either an IIR (Infinite Impulse Response) filter or an FIR (Finite Impulse Response) filter. FIGS. 10A and 10B are circuit diagrams each showing an example configuration of the digital calculation unit 152a configured as an FIR filter. FIG. 10A shows a direct-form filter, and FIG. 10B shows a transposed-form filter. The tap coefficients $a_0$ through $a_{N-1}$ may preferably be determined based on the transfer characteristics calculated based on the response characteristics of the main power supply 102 and the response characteristics of the target power supply 110. Specifically, the transfer characteristics can be calculated based on the conversion characteristics for conversion from the power supply voltage waveform to the compensation current waveform, i.e., based on the difference between the conductance values $G_{MAIN}$ and $G_{TGT}$.

Figure 11A:
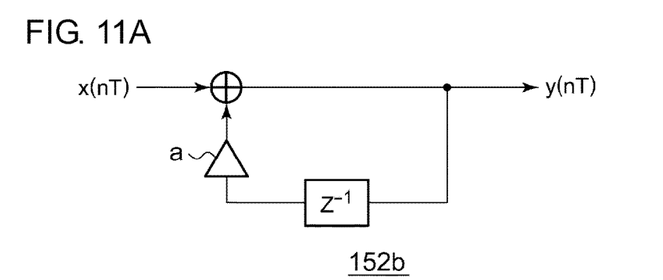
FIGS. 11A through 11C are circuit diagrams each showing an example configuration of a digital calculation unit of an IIR filter.
Figure 11B:
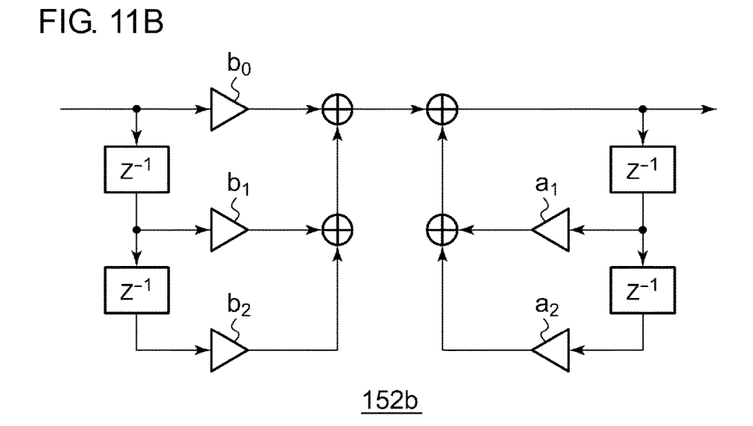
Figure 11C:
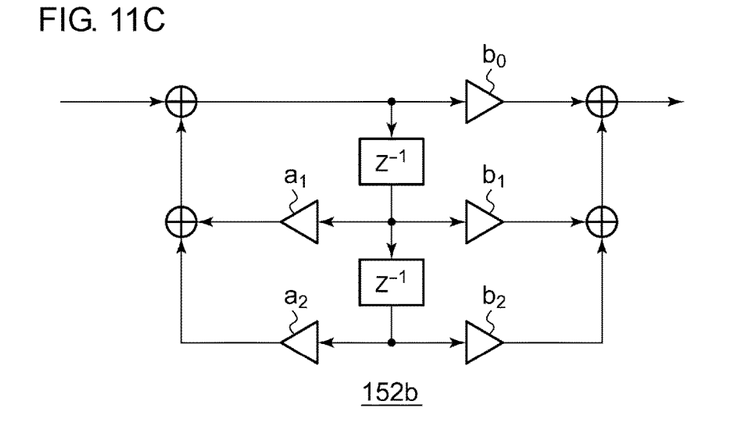

FIGS. 11A through 11C are circuit diagrams each showing an example configuration of the digital calculation unit 152b configured as an IIR filter. FIG. 11A shows a first-order IIR filter having transfer characteristics represented by the following Expression. Here, $z^{-1}$ represents a delay component.

$$H(z)=1/(1-a \cdot z^{-1})$$

FIG. 11B shows a second-order IIR filter having a direct-form I configuration. FIG. 11C shows a second-order IIR filter having a direct-form II configuration. The transfer characteristics of such a second-order IIR filter are represented by the following Expression using the tap coefficients $a_1$ and $a_2$ and $b_0$ through $b_2$.

$$H(z)=(b_0+b_1 \cdot z^{-1}+b_2 \cdot z^{-2})/(1-a_1 \cdot z^{-1}-a_2 \cdot z^{-2})$$

The tap coefficients of such a filter can be appropriately calculated so as to provide desired input/output characteristics required for the compensation circuit 104, which can be clearly understood by those skilled in this art. Accordingly, description of a calculation method will be omitted.

The digital calculation unit 152 may be configured as a combination of a processor and a software program, instead of such a digital filter.

Figure 12:
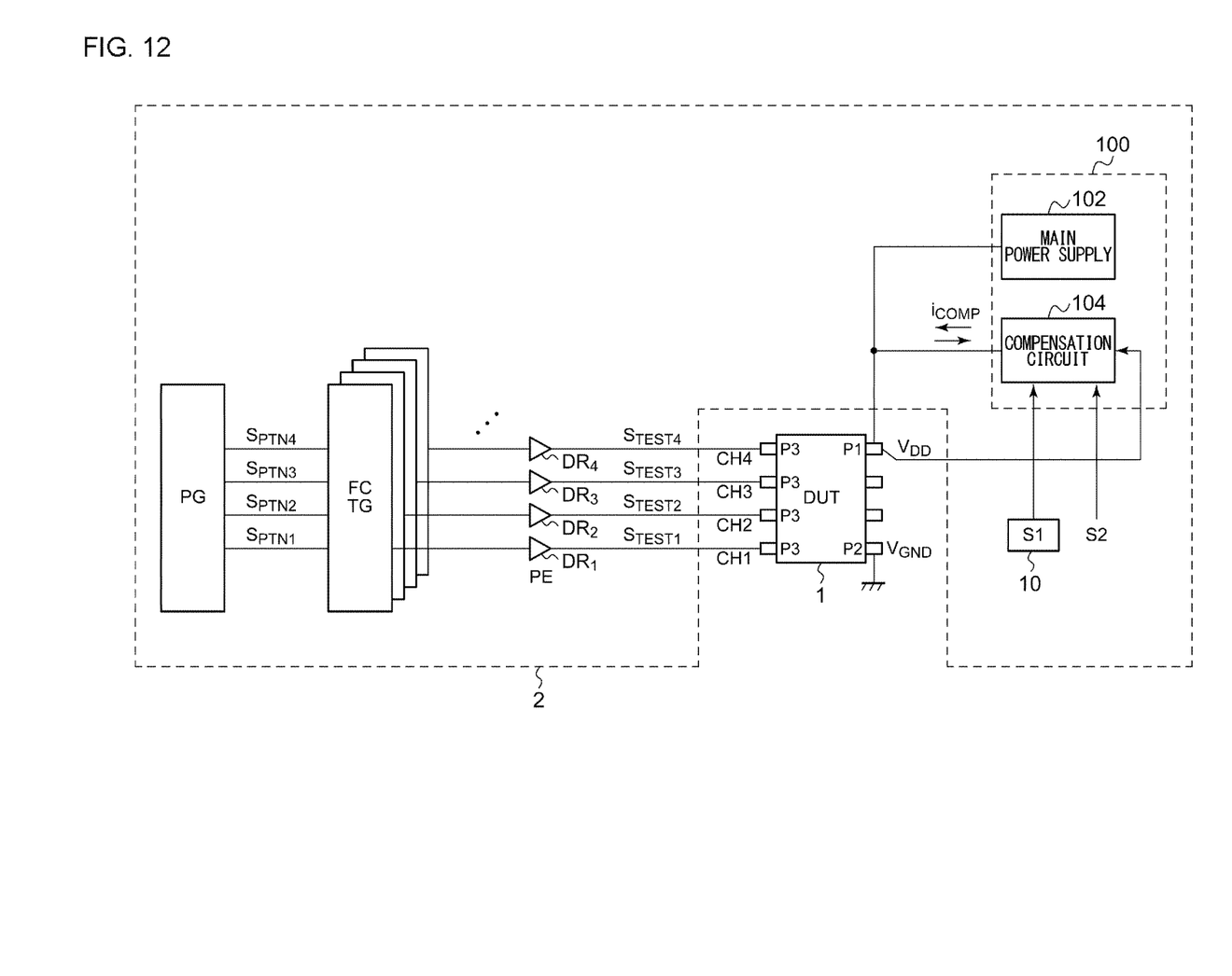
FIG. 12 is a block diagram showing a test apparatus including a power supply apparatus according to an embodiment.

Lastly, description will be made regarding the usage of the power supply apparatus 100. FIG. 12 is a block diagram showing a test apparatus 2 including the power supply apparatus 100 according to the embodiment. FIG. 12 also shows a semiconductor device to be tested (which will be referred as the "DUT" hereafter) in addition to the test apparatus 2.

The DUT 1 includes multiple pins. At least one of the multiple pins is used as a power supply terminal P1 configured to receive the power supply voltage $V_{DD}$. At least one of the multiple pins that differ from the power supply terminal P1 is used as a ground terminal P2. Furthermore, multiple input/output (I/O) terminals P3 are provided so as to allow data to be received from an external circuit or to be transmitted to an external circuit. In the test operation, the DUT 1 receives, via such a given I/O terminal P3, a test signal (test pattern) $S_{TEST}$ output from the test apparatus 2. Also, the DUT 1 transmits, to the test apparatus 2, via such a given I/O terminal P3, data that corresponds to the test signal $S_{TEST}$. FIG. 12 does not show a configuration for evaluating the signal received from the DUT 1.

The test apparatus 2 includes the aforementioned power supply apparatus 100, a pattern generator PG, multiple timing generator TG, multiple waveform shapers FC, and multiple drivers DR.

The test apparatus 2 includes multiple, i.e., n channels CH1 through CHn. A number of channels (CH1 through CH4) from among the n channels are assigned to the multiple I/O terminals P3 of the DUT 1. In actuality, the number of channels of the test apparatus 2 is on the order of several hundred to several thousand. With the test apparatus 2, the first channel CH1 through the fourth channel CH4 each function as a test unit that supplies a test pattern to the DUT 1.

The power supply apparatus 100 generates a power supply voltage $V_{DD}$ to be supplied to the power supply terminal P1 of the DUT 1. Accordingly, the DUT 1 corresponds to the aforementioned circuit 30, and the pin P1 corresponds to the power supply terminal 32. The power supply apparatus 100 includes the main power supply 102 and the compensation circuit 104.

The response characteristics (frequency characteristics) S1 of the main power supply 102 are measured beforehand or otherwise calculated beforehand by simulation, and are held by the compensation circuit 104. The kind of the data of the response characteristics S1 is not restricted in particular. For example, as described above, the data of the response characteristics S1 may be the conductance, impedance, impulse response, or the like, of the circuit network 108, which is held by memory. Before the test operation of the test apparatus 2, the response characteristics S2 of the target power supply 110 to be emulated by the test apparatus 2 are input. The input/output characteristics of the compensation circuit 104 are set according to the response characteristics of the main power supply 102 and the response characteristics of the target power supply 110 thus input.

The above is the configuration of the test apparatus 2. The test apparatus 2 is capable of emulating a desired power supply environment for an actual apparatus mounting the DUT 1, for example. This allows the DUT 1 to be tested under the same conditions as in the actual operation environment. This suppresses an overkill problem and a test escape problem.

Also, such an emulation function of the power supply apparatus 100 can be used in designing an actual equipment power supply circuit. For example, the response characteristics are emulated for a given target power supply 110. In this state, the yield ratio of the DUT 1 is estimated by measurement. If the yield ratio of the DUT 1 is insufficient, the response characteristics of the target power supply 110 are modified. This operation is repeatedly performed until the yield ratio reaches an allowable value, so as to determine the target response characteristics in the final stage. This allows a designer to design a power supply for an actual apparatus such that it has the target response characteristics thus determined.

Among the components of the power supply apparatus 100, the main power supply 102 is a hardware component that is also included in the test apparatus 2 according to a conventional technique. That is to say, only the compensation circuit 104 is a new additional component. The compensation circuit 104 may be configured including the calculation unit 130 and the current source 132, for example. Even in a case in which such a compensation circuit 104 is provided to each of all the channels, the test apparatus 2 having such a configuration requires only a small increase in costs, which does not become a significant problem. That is to say, such an arrangement has an advantage of a reduction in costs required for the test operation as compared with conventional arrangements in which a compensation current is generated by means of a feedforward control operation according to a test pattern.

Furthermore, the power supply apparatus 100 performs a feedback control operation instead of a prediction control operation (feedforward control operation). Such an arrangement is capable of compensating for various kinds of variations in the DUT even if such variations include an unknown variation component such as individual variations in the DUT characteristics. Thus, there is no need to measure the DUT characteristics beforehand for every DUT, thereby allowing the costs required for the test operation to be further reduced.

In addition, in a case of employing such a power supply apparatus 100, such an arrangement does not require the device operation conditions (test pattern $S_{TEST}$). Thus, such an arrangement has an advantage of involving no reduction in the range of application.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Description has been made with reference to FIGS. 7 and 8 regarding an arrangement in which the calculation unit 130 is configured as an inverting amplifier (filter). However, the present invention is not restricted to such an arrangement. Also, the calculation unit 130 may be configured as a non-inverting amplifier (filter).

[Second Modification]

Description has been made with reference to FIG. 5 regarding an arrangement in which the circuit network 108 (circuit network 114) is configured as multiple separate shunt circuits 122 in parallel. However, the present invention is not restricted to such an arrangement. For example, a series circuit may be arranged between the upper-side terminal of the shunt circuit 122_$i$ and the upper-side terminal of the shunt circuit 122_$i$+1. That is to say, the circuit network 108 may be configured as a combination of shunt circuits and series circuits.

[Third Modification]

Description has been made in the embodiment with reference to FIGS. 5A and 5B regarding an arrangement in which each separate shunt circuit (or otherwise series circuit) 122 is associated with a corresponding compensation unit in a one-to-one manner. However, the present invention is not restricted to such an arrangement. In a case in which the calculation unit 130 is configured as a digital filter, by appropriately setting the tap coefficients of the filter, such an arrangement allows a single compensation unit 120 to compensate for the multiple circuits 122. Also, in a case in which the calculation unit 130 is configured as an analog circuit, by modifying the circuit configuration of the amplifier (filter), such an arrangement allows a single compensation unit 120 to compensate for the multiple circuits 122.

[Fourth Modification]

Description has been made in the embodiment regarding an application in which the power supply apparatus 100 is employed in the test apparatus 2. However, the present invention is not restricted to such an application. Also, the compensation circuit 104 may further be provided to an existing power supply circuit (main power supply) for typical electronic devices, industrial equipment, in-vehicle devices, consumer electronics devices, etc., thereby providing desired power supply characteristics.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A power supply apparatus being capable of emulating a target power supply, comprising:
    a main power supply configured as a constant voltage source having its output terminal coupled to a semiconductor device via a power supply line and structured to control a voltage at its output terminal such that a power supply voltage to be supplied to the semiconductor device approaches a reference voltage; and
    a compensation circuit having its input terminal coupled to receive, as a feedback signal, a detection signal that corresponds to the power supply voltage, having its output terminal coupled to the power supply line, and structured to inject or otherwise draw a compensation current that corresponds to the detection signal to or otherwise from the power supply line, wherein the compensation circuit has its input/output characteristics that correspond to characteristics of the main power supply and characteristics of the target power supply.

2. The power supply apparatus according to claim 1, wherein the input/output characteristics correspond to a conductance of the main power supply and a conductance of the target power supply.

3. The power supply apparatus according to claim 2, wherein the input/output characteristics correspond to a difference between the conductance of the main power supply and the conductance of the target power supply.

4. The power supply apparatus according to claim 3, wherein the compensation circuit comprises:

a calculation unit structured to generate a control signal that indicates a current that flows through a conductance that corresponds to the aforementioned difference when the power supply voltage indicated by the detection signal is applied; and a current source structured to generate the compensation current that corresponds to the control signal.

5. The power supply apparatus according to claim 4, wherein the calculation unit comprises an analog filter or otherwise an analog amplifier.

6. The power supply apparatus according to claim 4, wherein the calculation unit comprises a digital filter structured to receive the detection signal in the form of a digital signal.

7. The power supply apparatus according to claim 4, wherein, in a case in which the main power supply and the target power supply can each be regarded as a plurality of electrically equivalent circuits in parallel, the compensation circuit comprises a plurality of calculation units each structured to calculate a compensation current for a corresponding circuit.

8. A test apparatus comprising the power supply apparatus according to claim 1, structured to supply a power supply voltage to a power supply terminal of a device under test.

9. A method for supplying a power supply voltage, comprising:

coupling a main power supply configured as a constant voltage source to a semiconductor device to which the power supply voltage is to be supplied via a power supply line;

coupling a compensation circuit to the power supply line;

setting, for the compensation circuit, input/output characteristics that correspond to characteristics of the main power supply and characteristics of a target power supply to be emulated; and inputting a detection signal that corresponds to the power supply voltage as a feedback signal to an input of the compensation circuit, so as to inject or otherwise draw a compensation current generated by the compensation circuit to or otherwise from the power supply line.

* * * * *